(12) United States Patent
Matsubara et al.

(10) Patent No.: US 11,271,560 B2
(45) Date of Patent: Mar. 8, 2022

(54) GATE DRIVE DEVICE AND SWITCHING DEVICE

(71) Applicant: FUJI ELECTRIC CO., LTD., Kanagawa (JP)

(72) Inventors: Kunio Matsubara, Hino (JP); Tsuyoshi Nagano, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/183,387

(22) Filed: Feb. 24, 2021

(65) Prior Publication Data

US 2021/0184670 A1 Jun. 17, 2021

Related U.S. Application Data

(63) Continuation of application No. PCT/JP2019/029162, filed on Jul. 25, 2019.

(30) Foreign Application Priority Data

Jan. 10, 2019 (JP) .............................. JP2019-002610

(51) Int. Cl.
*H02M 1/08* (2006.01)
*H03K 17/16* (2006.01)
*H02M 1/00* (2006.01)

(52) U.S. Cl.
CPC ............ *H03K 17/165* (2013.01); *H02M 1/08* (2013.01); *H02M 1/0054* (2021.05)

(58) Field of Classification Search
CPC ..... H02M 1/0054; H02M 1/08; H03K 17/165

USPC .......................................... 327/108, 109, 110
See application file for complete search history.

(56) References Cited

U.S. PATENT DOCUMENTS

| 5,808,504 | A | * | 9/1998 | Chikai | ............... | H03K 17/0406 |
| | | | | | | 327/434 |
| 5,986,484 | A | * | 11/1999 | Kimata | .............. | H03K 17/0828 |
| | | | | | | 323/908 |
| 9,745,947 | B2 | * | 8/2017 | Gillberg | .................. | F02P 17/12 |
| 9,900,000 | B2 | * | 2/2018 | Kanamori | ............ | H03K 17/165 |
| 10,547,300 | B1 | * | 1/2020 | Matsubara | ............... | H03K 7/08 |
| 10,819,212 | B1 | * | 10/2020 | Nagano | .................. | H02M 1/08 |
| 10,855,272 | B1 | * | 12/2020 | Nagano | ............... | H03K 17/165 |
| 11,056,965 | B2 | * | 7/2021 | Matsubara | ............ | H02M 3/158 |

(Continued)

FOREIGN PATENT DOCUMENTS

| JP | 2001346376 A | 12/2001 |
| JP | 2008078816 A | 4/2008 |

(Continued)

OTHER PUBLICATIONS

(ISA/237) Written Opinion of the International Search Authority for International Patent Application No. PCT/JP2019/029162, issued/mailed by the Japan Patent Office dated Sep. 10, 2019.

*Primary Examiner* — William Hernandez (57) ABSTRACT

Provided is a gate drive device, including: a gate drive unit for driving a gate of a switching element; a measurement unit for measuring a parameter that changes according to a current flowing through the switching element; and a switching unit for switching a changing speed of a gate voltage of the switching element by the gate driving unit after a first reference period from a start of turning off the switching element based on the parameter.

20 Claims, 6 Drawing Sheets

(56) References Cited

U.S. PATENT DOCUMENTS

| | | | |
|---|---|---|---|
| 2004/0252435 A1* | 12/2004 | Ishikawa | H03K 17/0828 361/100 |
| 2007/0115038 A1* | 5/2007 | Higashi | H03K 17/28 327/207 |
| 2009/0116265 A1* | 5/2009 | Saji | H02M 3/33507 363/37 |
| 2010/0231269 A1* | 9/2010 | Nakatake | H03K 17/08128 327/109 |
| 2014/0160601 A1 | 6/2014 | Ouyang | |
| 2014/0253184 A1 | 9/2014 | Yamauchi | |
| 2015/0256105 A1 | 9/2015 | Kano | |
| 2015/0282290 A1 | 10/2015 | Borowy | |
| 2017/0093392 A1 | 3/2017 | Kobayashi | |
| 2018/0062633 A1* | 3/2018 | Nomura | H03K 3/012 |
| 2018/0205372 A1* | 7/2018 | Sasaki | H03K 17/0828 |
| 2018/0316344 A1* | 11/2018 | Matsubara | H03K 17/162 |
| 2019/0190511 A1* | 6/2019 | Matsubara | H03K 17/163 |
| 2020/0021282 A1* | 1/2020 | Yamamoto | H03K 17/168 |
| 2020/0036380 A1* | 1/2020 | Matsubara | H02M 1/08 |
| 2021/0099170 A1* | 4/2021 | Tanghe | H03K 17/166 |

FOREIGN PATENT DOCUMENTS

| | | |
|---|---|---|
| JP | 2008182835 A | 8/2008 |
| JP | 2008193717 A | 8/2008 |
| JP | 2009118650 A | 5/2009 |
| JP | 2009195017 A | 8/2009 |
| JP | 4742828 B2 | 8/2011 |
| JP | 4935266 B2 | 5/2012 |
| JP | 5516705 B2 | 6/2014 |
| JP | 2014176228 A | 9/2014 |
| JP | 2015204659 A | 11/2015 |
| JP | 2016077110 A | 5/2016 |
| JP | 6168253 B1 | 7/2017 |
| JP | 6266478 B2 | 1/2018 |
| JP | 6290118 B2 | 3/2018 |

* cited by examiner

GATE DRIVE DEVICE AND SWITCHING DEVICE

The contents of the following Japanese patent application are incorporated herein by reference:
 2019-002610 filed in JP on Jan. 10, 2019
 PCT/JP2019/029162 filed in WO on Jul. 25, 2019.

BACKGROUND

1. Technical Field

The present invention relates to a gate drive device and a switching device.

2. Related Art

Conventionally, in a gate drive device that drives the gate of a switching element, the changing speed of the gate voltage is reduced to reduce the surge voltage at turn-off (see, for example, Patent Document 1-3).
 Patent Document 1: U.S. Pat. No. 6,290,118 Specification
 Patent Document 2: U.S. Pat. No. 6,266,478 Specification
 Patent Document 3: U.S. Pat. No. 4,935,266 Specification If the changing speed of the gate voltage is reduced uniformly, the turn-off loss may increase.

SUMMARY

A first aspect of the present invention provides a gate drive device. The gate drive device may include a gate drive unit for driving the gate of the switching element. The gate drive device may include a measurement unit for measuring a parameter that changes according to a current flowing through the switching element. The gate drive device may include a switching unit for switching the changing speed of the gate voltage of the switching element by the gate drive unit, after the first reference period from the start of turning off the switching element based on the parameter.

The switching unit may switch the changing speed of the gate voltage after the first reference period from the start of turning off the switching element during a turn-off period of the switching element.

The switching unit may reduce the changing speed of the gate voltage after the first reference period from the start of turning off the switching element during the turn-off period of the switching element.

The switching unit may change the changing speed of the gate voltage after the first reference period from the start of turning off the switching element during one turn-off period of the switching element, with respect to the changing speed of the gate voltage after the first reference period from the start of turning off the switching element during another turn-off period.

The switching unit may switch the changing speed of the gate voltage after the first reference period from the start of turning off the switching element in the next and subsequent turn-off periods of the switching element, based on the parameter measured in the previous switching cycles of the switching element.

The first reference period may be the period from the start of turning off the switching element to the timing at which the voltage generated between main terminals of the switching element reaches a peak at the latest.

The first reference period may be the period from the start of turning off the switching element to the timing at which the Miller period of the gate voltage ends.

The switching unit may have a switching determination unit for determining whether to switch the changing speed of the gate voltage according to the comparison result of the parameter and the reference value.

The parameter may indicate the current when the switching element is at ON state. The parameter may indicate the period from the start of turning off the switching element until the voltage applied between the between the main terminals of the switching element reaches the reference voltage. The parameter may indicate a voltage applied to the switching element after the second reference period from the start of turning off the switching element.

The parameter may indicate the surge voltage generated when the switching element is turned off. The switching unit may switch the changing speed of the gate voltage based on the parameter and whether the changing speed of the gate voltage is switched in the switching cycle in which the parameter is measured.

A second aspect of the present invention provides a switching device. The switching device may include a gate drive device according to the first aspect. The switching device may include a switching element whose gate is driven by the gate drive device.

The switching element may be a wide bandgap semiconductor element.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. Further, not all of the combinations of features described in the embodiments are essential to the solving means of the invention. It should be noted that throughout the embodiments, the same components are designated by the same reference numerals, and a duplicate description will be omitted.

Figure 1:
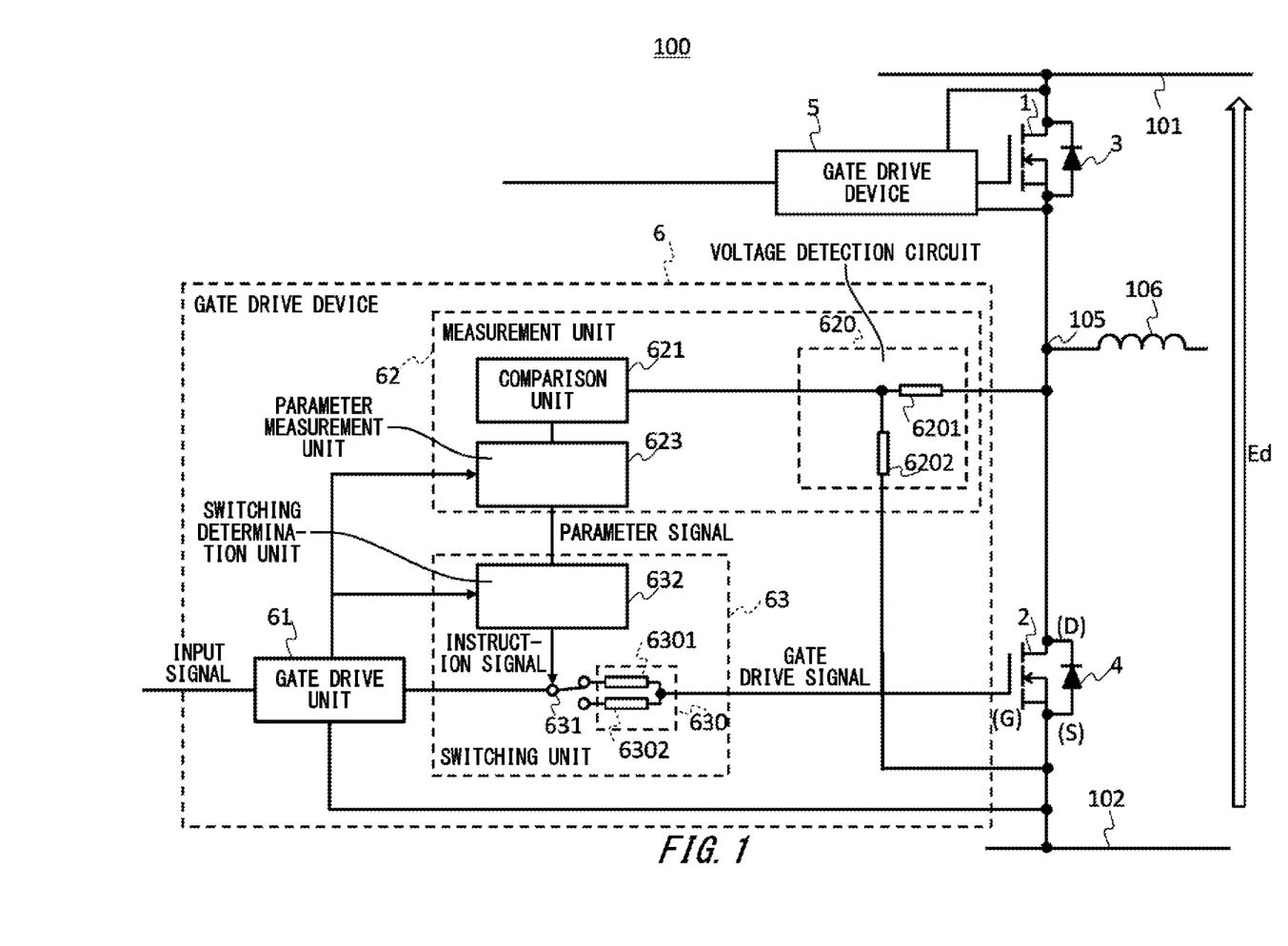
FIG. 1 illustrates a switching device 100 according to this embodiment.

[1. Configuration of switching device 100] FIG. 1 illustrates the switching device 100 according to this embodiment. In addition, in the figure, the outline arrow simple indicates the voltage.

The switching device 100 shows one phase of a power conversion device used for driving a motor or supplying power as one example, and switches the connection between the positive power source line 101 and the negative power source line 102, and the power source output terminal 105, and then outputs the converted voltage from the power source output terminal 105.

Herein, a DC voltage Ed of, for example, 600-800V, is applied between the positive power source line 101 and the negative power source line 102, and the negative power source line 102 is connected to the reference potential (ground potential as one example) of the entire switching device 100. An induction load 106 may be connected to the power source output terminal 105. The switching device 100 includes a main switching element 1 on the positive side and a main switching element 2 on the negative side, freewheeling diodes 3 and 4 connected in antiparallel to the main switching element 1 and 2, a gate drive device 5 on the positive side, and a gate drive device 6 on the negative side.

[1-1. Main switching elements 1, 2] Each of the main switching elements 1 and 2 is one example of switching elements, and electrically connect or disconnect between the drain terminal and the source terminal. For example, the main switching elements 1 and 2 are switched on (also referred to as connection)/off (also referred to as disconnection) by the gate drive devices 5 and 6 described below. Herein, as one example of this embodiment, the main switching elements 1 and 2 are sequentially connected in series between the negative power source line 102 and the positive power source line 101 to form an upper arm and a lower arm in the power conversion device. The power source output terminal 105 is connected to the center points of the main switching elements 1 and 2.

Main switching elements 1 and 2 are silicon semiconductor elements having silicon as a base material. Alternatively, at least one of the main switching elements 1 and 2 may also be a wide bandgap semiconductor element. The wide bandgap semiconductor element is a semiconductor element having a bandgap larger than that of a silicon semiconductor element, and is a semiconductor element including, for example, SiC, GaN, diamond, gallium nitride-based material, gallium oxide-based material, AlN, AlGaN, ZnO, or the like. The wide bandgap semiconductor element can improve the switching speed more than the silicon semiconductor element. In addition, in this embodiment, the main switching elements 1 and 2 are MOSFETs (Metal Oxide Semiconductor Field Effect Transistors), and may have a parasitic diode (not shown) in which the positive power source line 101 side is a cathode.

[1-2. Freewheeling diodes 3 and 4] The freewheeling diodes 3 and 4 are connected in antiparallel to the main switching elements 1 and 2. The freewheeling diodes 3 and 4 may be Schottky barrier diodes or MOSFET parasitic diodes. The freewheeling diodes 3 and 4 may be silicon semiconductor elements or wide bandgap semiconductor elements.

[1-3. Gate drive devices 5 and 6] The gate drive devices 5 and 6 drive the gates of the corresponding main switching elements 1 and 2 based on an input signal input from the outside. The input signal may control the main switching elements 1 and 2 by PWM control to output a substantially sinusoidal alternating current from the power source output terminal 105. The input signal may be separately input to the main switching element 1 and the main switching element 2. In addition, as one example of this embodiment, when the input signal is high (ON command signal), the main switching element 2 is instructed to be turned on, and when the input signal is low (OFF command signal), the main switching element 2 is instructed to be turned off.

The positive-side gate drive device 5 drives the gate of the main switching element 1, and the negative-side gate drive device 6 drives the gate of the main switching element 2. In addition, since the gate drive devices 5 and 6 have the same configuration, the negative-side gate drive device 6 will be described in this embodiment, and the positive-side gate drive device 5 will be omitted.

The gate drive device 6 has a gate drive unit 61, a measurement unit 62, and a switching unit 63. In this embodiment, as one example, each unit of the gate drive device 6 is described as an analog circuit.

[1-3-1. Gate drive unit 61] The gate drive unit 61 drives the gate of the main switching element 2 based on the turn-on signal and the turn-off signal included in the input signal from the outside. The gate drive unit 61 supplies a gate drive signal (ON command signal/OFF command signal) for instructing ON/OFF to the gate terminal of the main switching element 2. The gate drive unit 61 may supply the gate drive signal to the measurement unit 62 and the switching unit 63. The gate drive unit 61 may be connected to the source terminal of the main switching element 2 and use the potential of the source terminal as the reference potential of the gate drive signal.

[1-3-2. Measurement unit 62] The measurement unit 62 measures a parameter that changes according to the current flowing through the main switching element 2 (for example, the current $I_d$ flowing through the drain terminal). As one example of this embodiment, the parameter may indicates a period $\Delta T$ from the start of turning off the main switching element 2, until the voltage applied between the main terminals of the main switching element 2 (as one example of this embodiment, the voltage $V_{ds}$ applied between the source terminal and the drain terminal) reaching the reference voltage $V_{ref}$. When the current $I_d$ flowing through the main switching element 2 increases, the period $\Delta T$ decreases. The reference voltage $V_{ref}$ may be a predetermined voltage between the DC voltage Ed and the peak voltage of the source drain voltage $V_{ds}$ during the turn-off period of the main switching element 2. The measurement unit 62 has a voltage detection circuit 620, a comparison unit 621, and a parameter measurement unit 623.

[1-3-2-1. Voltage detection circuit 620] The voltage detection circuit 620 detects the voltage $V_{ds}$. For example, the voltage detection circuit 620 has resistances 6201 and 6202 for dividing the voltage $V_{ds}$. The center points of the resistances 6201 and 6202 are connected to the comparison unit 621 and supply the detected voltage to the comparison unit 621. In addition, in this embodiment, the detected voltage is taken as a positive voltage when the potential of the drain terminal side is higher than that of the source terminal side.

[1-3-2-2. Comparison unit 621] The comparison unit 621 compares the voltage $V_{ds}$ detected by the voltage detection circuit 620 with the reference voltage $V_{ref}$. For example, the comparison unit 621 may be a comparator, and the voltage $V_{ds}$ may be input to the non-inverting input terminal and the reference voltage $V_{ref}$ may be input to the inverting input terminal. The comparison unit 621 supplies a trigger signal to the parameter measurement unit 623 in response to the voltage $V_{ds}$ becoming larger than the reference voltage $V_{ref}$.

[1-3-2-3. Parameter measurement unit 623] The parameter measurement unit 623 measures the parameter based on the comparison result by the comparison unit 621. The measurement unit 62 may measure the parameter during the turn-off period of the main switching element 2. For example, the parameter measurement unit 623 may detect the reception timing of the OFF command signal included in the gate drive signal from the gate drive unit 61 as the turn-off start timing of the main switching element 2. The parameter measurement unit 623 may measure the elapsed period from the detected start timing, to the reception of the trigger signal as a parameter. The parameter measurement unit 623 supplies the parameter signal indicating the measured parameter to the switching determination unit 632. The parameter measurement unit 623 may be reset each time the OFF command signal is received.

[1-3-3. Switching unit 63] Based on the parameter signal supplied by the measurement unit 62, the switching unit 63, switches the changing speed of the gate voltage of the main switching element 2, by the gate drive unit 61, after the first reference period $\Delta T_{ref1}$ from the start of turning off the main switching element 2. The switching unit 63 may switch the changing speed of the gate voltage after the lapse of the first reference period $\Delta T_{ref1}$ during the turn-off period of the main switching element 2, and may decrease the changing speed as one example.

The first reference period $\Delta T_{ref1}$ may be the period from the start of turning off the main switching element 2, to the timing when the voltage $V_{ds}$ of the main switching element 2 reaches the peak at the latest. The switching unit 63 has a gate resistor 630, a connection switching unit 631, and a switching determination unit 632. Also, the end timing of the first reference period $\Delta T_{ref1}$ may also be the same as the end timing of the Miller period of the gate voltage.

[1-3-3-1. Gate resistor 630] The gate resistor 630 has two gate resistors 6301 and 6302 with resistance values different from each other. The resistance value of the gate resistor 6301 may be larger than the resistance value of the gate resistor 6302. As one example of this embodiment, the gate resistors 6301 and 6302 each has one end connected to the gate of the main switching element 2, and has the other end connected to the connection switching unit 631. In addition, the gate resistor 630 may also have another configuration as long as the resistance value can be changed during the turn-off period of the main switching element 2.

[1-3-3-2. Connection switching unit 631] The connection switching unit 631 switches the resistance value of the gate resistor 630. Thereby, the changing speed of the gate voltage is switched. As one example of this embodiment, the connection switching unit 631 electrically connects either one of the two gate resistors 6301 and 6302 to the gate in a selective manner. The connection switching unit 631 may electrically connect the other end (the end opposite to the gate side) of either of the gate resistors 6301 and 6302 to the gate drive unit 61 according to the instruction signal from the switching determination unit 632. In addition, the connection switching unit 631 may also have a configuration in which each of the gate resistors 6301 and 6302 includes a switch that can be turned on and off. In this case, the switching determination unit 632 may also control ON/OFF of each switch. As one example, when switching the changing speed of the gate voltage, either one of the switches corresponding to the gate resistors 6301 and 6302 may be turned off from the state in which the switches are respectively turned on.

[1-3-3-3. Switching determination unit 632] The switching determination unit 632 determines whether to switch the changing speed of the gate voltage according to the comparison result between the parameter supplied by the measurement unit 62 (as one example of this embodiment, the period $\Delta T$ from the start of turning off the main switching element 2 to the voltage $V_{ds}$ reaching the reference voltage $V_{ref}$) and the reference value. The reference value may be the parameter value when the surge voltage generated by the turn-off of the main switching element 2 reaches the lowest element breakdown voltage among the element breakdown voltages of all elements in the switching device 100. As one example of this embodiment, when the surge voltage of the element breakdown voltage is generated, the reference value may be the period from the start of the turn-off, to the timing when the voltage $V_{ds}$ reaches the reference voltage $V_{ref}$ (also referred to as the third reference period $\Delta T_{ref3}$). The switching determination unit 632 may determine the switching of the changing speed of the gate voltage, according to the period $\Delta T$ being shorter than the third reference period $\Delta T_{ref3}$. Thereby, switching is performed when the surge voltage larger than the element breakdown voltage is generated. In addition, the third reference period $\Delta T_{ref3}$ and the first reference period $\Delta T_{ref1}$ may be the same or different. When the third reference period $\Delta T_{ref3}$ is different from the first reference period $\Delta T_{ref1}$, the third reference period $\Delta T_{ref3}$ may be longer or shorter than the first reference period $\Delta T_{ref1}$.

The switching determination unit 632 supplies an instruction signal for instructing whether to perform the switching to the connection switching unit 631. The switching determination unit 632 may output the instruction signal at the timing when the first reference period $\Delta T_{ref1}$ elapses from the start of turning off the main switching element 2 based on the gate drive signal from the gate drive unit 61.

In addition, the switching determination unit 632 may return the connection object to the gate resistor 6302 by the start of the next turn-off at the latest when the connection object to the gate is switched to the gate resistor 6301. As one example, the switching determination unit 632 may return the connection object to the gate resistor 6302 after a lapse of a predetermined period from the completion of the turn-off, or may return the connection object to the gate resistor 6302 in response to the reception of the ON command signal included in the gate drive signal.

With the above switching device 100, the changing speed of the gate voltage of the main switching element 2 may be switched, after the first reference period $\Delta T_{ref1}$ from the start of turning off the main switching element 2, based on the parameter that changes according to the current $I_d$ flowing through the main switching element 2. Accordingly, when the higher surge voltage than the element breakdown voltage is generated as a result of the turn-off of the main switching element 2, as the change of the gate voltage can be delayed, the element destruction due to the surge voltage can be prevented. Also, when the lower surge voltage than the element breakdown voltage due to the turn-off of the main switching element 2 is generated, as the change of the gate voltage can be accelerated, the turn-off loss can be reduced. Therefore, unlike the case where the gate voltage is uniformly delayed, an increase in turn-off loss due to unnecessary reduction of the surge voltage can be prevented.

Also, as the period $\Delta T$ from the start of turning off the main switching element 2 to the voltage $V_{ds}$ reaching the reference voltage $V_{ref}$ is measured as a parameter, the current $I_d$ flowing through the main switching element 2 can be indirectly measured. Accordingly, the cost of the switching device 100 can be reduced as compared with the case where the current $I_d$ flowing through the main switching element 2 is directly measured.

Also, as the changing speed of the gate voltage after the first reference period $\Delta T_{ref1}$ from the start of turning off the main switching element 2 during the turn-off period of the main switching element 2 is switched, the element destruction due to the surge voltage at the turn-off is reliably prevented, and at the same time, the turn-off loss can be reduced.

Also, as the first reference period $\Delta T_{ref1}$ is the period from the start of turning off the main switching element 2 to the timing when the voltage $V_{ds}$ reaches its peak at the latest, or to the timing when the Miller period of the gate voltage ends, the peak voltage generated between the main terminals, and thus the surge voltage, can be reduced. Accordingly, the element destruction due to the surge voltage can be surely prevented.

Also, as either one of the two gate resistors 6301 and 6302 having different resistance values to each other is selectively connected to the gate of the main switching element 2, so the changing speed of the gate voltage can be surely switched.

Figure 2:
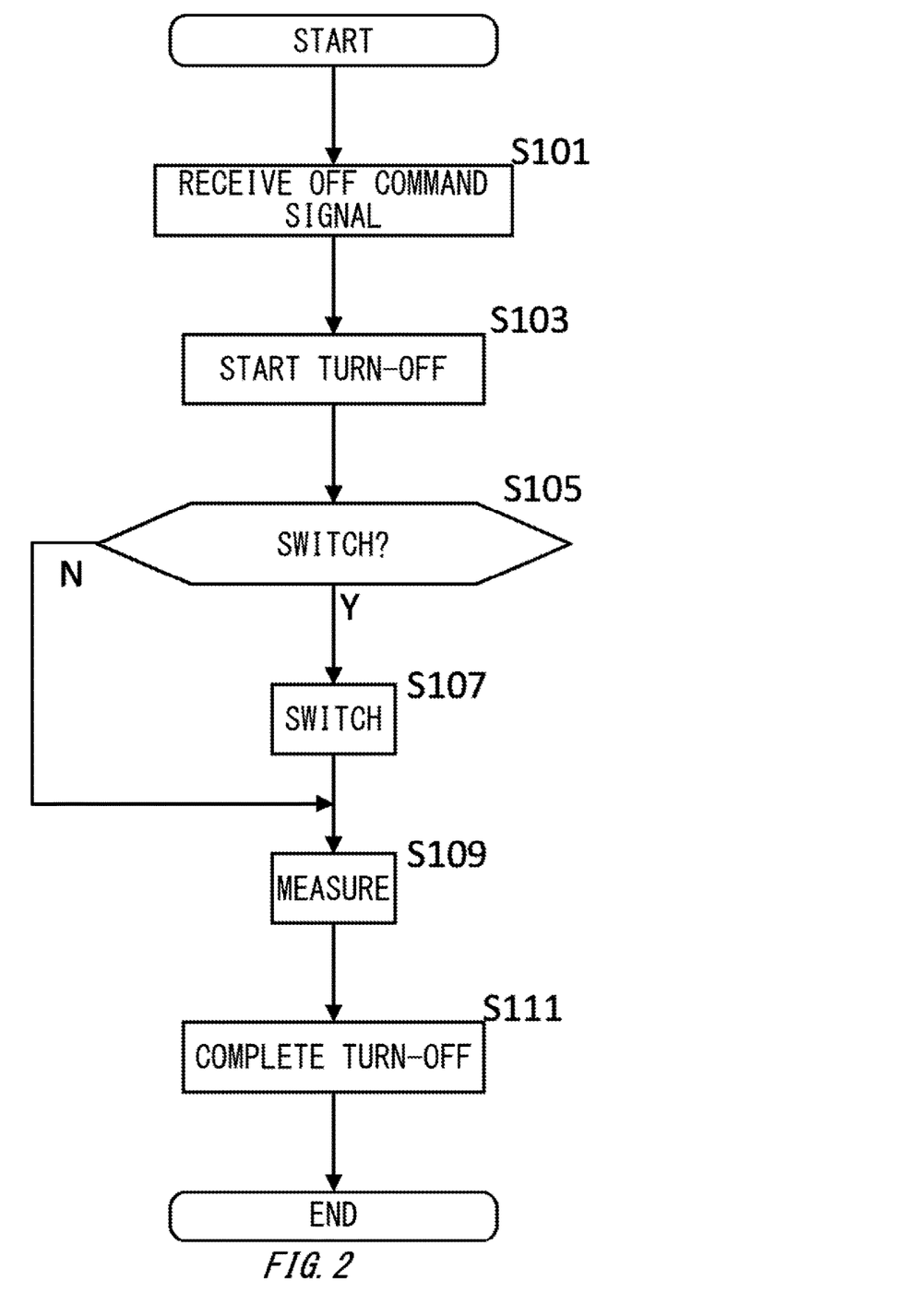
FIG. 2 illustrates the operations of the switching device 100.

[2. Operations] FIG. 2 illustrates the operations of the switching device 100. The switching device 100 changes the drive conditions by performing the processing of step S101-S111 during the turn-off period of the main switching element 2.

At step S101 the gate drive unit 61 receives the OFF command signal included in the input signal from the outside. The gate drive unit 61 at step S103 outputs the gate drive signal instructing the turn-off, and starts the turn-off of the main switching element 2.

The switching determination unit 632 at step S105 determines whether to switch the changing speed of the gate voltage in response to the comparison result between the parameter supplied by the measurement unit 62 and the reference value. The switching determination unit 632 may determine whether to switch the changing speed of the gate voltage during the next turn-off period, based on the measured parameter in the previous switching cycle. As one example of this embodiment, the switching determination unit 632 maintains the gate resistor 6301 as the connection object to the gate when the parameter is larger than the reference value, and determines to switch from the gate resistor 6302 to the gate resistor 6301 as the connection object to the gate when the parameter is smaller than the reference value. The switching determination unit 632 transfers the processing to step S107 when the switching is determined to be performed (step S105; Yes), and transfers the processing to S109 when the switching is determined not to be performed (step S105; No).

The switching unit 63 at step S107 switches the changing speed of the gate voltage. As one example of this embodiment, the switching determination unit 632 outputs an instruction signal for switching to reduce the changing speed of the gate voltage, that is, an instruction signal for switching the connection object to the gate from the gate resistor 6302 to the gate resistor 6301, and causes the connection switching unit 631 to execute the switching. Thereby, compared with the case where the gate resistor 6302 is connected to the gate, the charge implantation speed into the gate of the main switching element 2, and thus the changing speed of the gate are reduced, and the surge voltage associated with turn-off is reduced. The switching unit 63 may perform the switching at the timing of the lapse of the first reference period $\Delta T_{ref1}$ from the start of the turn-off. As one example, the switching unit 63 may perform switching at any timing from the start timing of the turn-off this time to the timing when the voltage $V_{ds}$ of the main switching element 2 reaches its peak during the turn-off period this time.

In this manner, when the determination result at step S105 is positive (step S105; Yes), the changing speed of the gate voltage during the turn-off period of the main switching element 2 is changed, and when the determination result is negative (step S105; No), the changing speed is not changed. Therefore, the changing speed of the gate voltage after the first reference period $\Delta T_{ref1}$ from the start of the turn-off during one turn-off period of the main switching element 2 is changed with respect to the changing speed of the gate voltage after the first reference period $\Delta T_{ref1}$ from the start of the turn-off during another turn-off period.

The measurement unit 62 at step S109 measures the parameter. As one example of this embodiment, the measurement unit 62 measures the period $\Delta T$ from the start of turning off the main switching element 2 to the voltage $V_{ds}$ reaching the reference voltage $V_{ref}$ as the parameter.

And then, when the turn-off of the main switching element 2 completes at step S111, the switching device 100 ends the operations related to the turn-off. In addition, the processing of step S109 for measuring the parameters may be performed at any timing between steps S103 and S107. Also, when the changing speed of the gate resistor is switched at step S107, the switching unit 63 may also return the changing speed to the state before the switching by the start of the next turn-off.

With the above operations, the changing speed of the gate voltage during one turn-off period of the main switching element 2 is changed with respect to the changing speed of the gate voltage during another turn-off period, so that the element destruction due to the surge voltage during each turn-off period can be prevented, and at the same time the turn-off loss can be reduced.

Also, the changing speed of the gate voltage in the next turn-off period is switched based on the parameter measured in the previous switching cycle of the main switching element 2. Accordingly, different from the case where the changing speed of the gate voltage is switched based on the parameter measured within the same switching cycle, the switching can be reliably performed even when the switching cycle is short.

Figure 3:
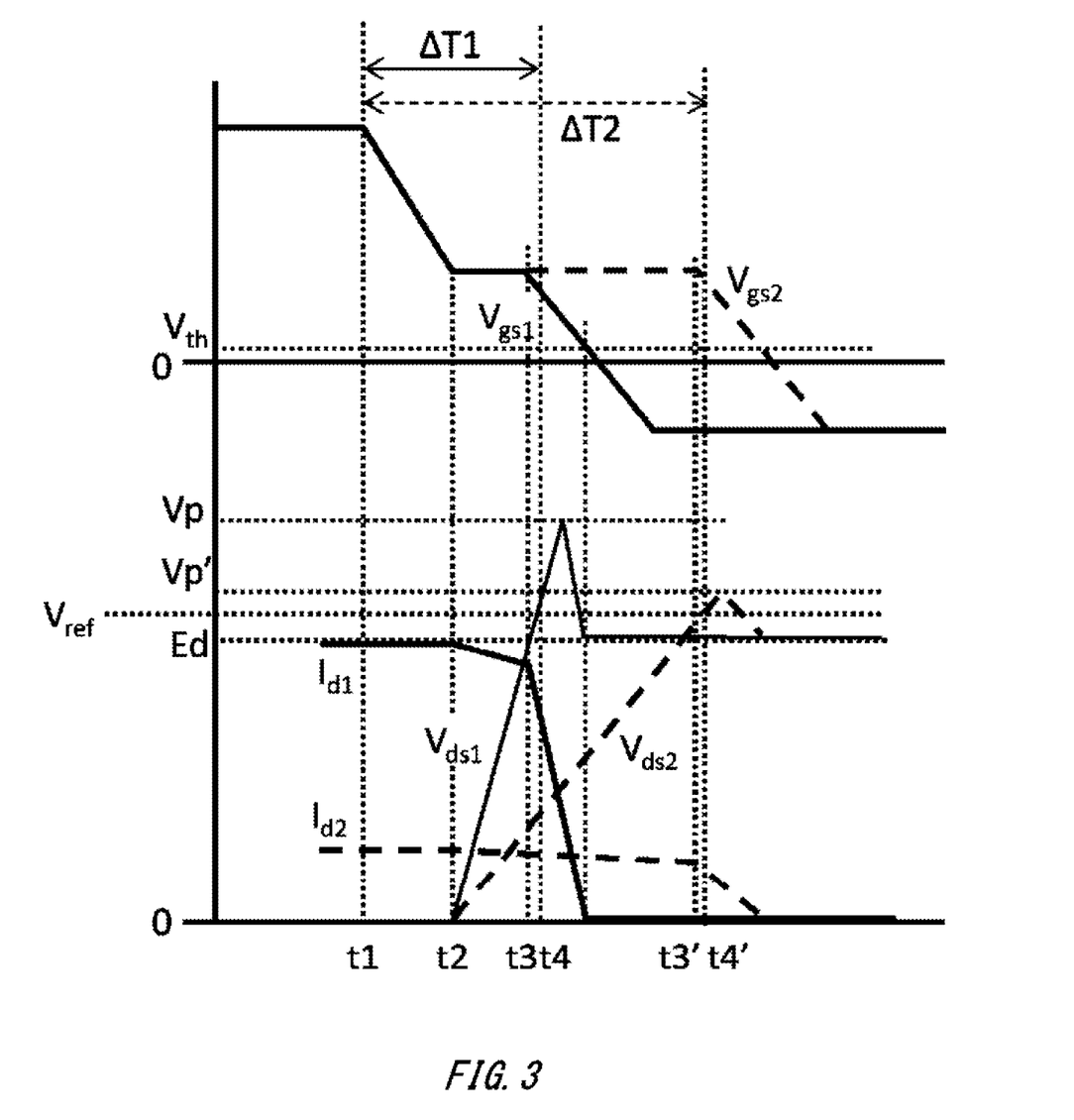
FIG. 3 illustrates the operation waveform at the turn-off of the main switching element 2.

[3. Operation Waveform] [3-1. Relationship Between Current $I_d$ and Period $\Delta T$] FIG. 3 illustrates the operation waveform at the turn-off of the main switching element 2. In the figure, the graphs of the gate source voltage $V_{gs1}$, the drain-source voltage $V_{ds1}$ and the drain current $I_{d1}$ illustrated by solid lines illustrate the operation waveforms when the current $I_d$ flowing through the main switching element 2 is large. The graphs of the gate source voltage $V_{gs2}$, the drain-source voltage $V_{ds2}$ and the drain current $I_{d2}$ illustrated by dashed lines illustrate the operation waveforms when the current $I_d$ flowing through the main switching element 2 is small. In addition, in the figure, the horizontal axis indicates time, and the vertical axis indicates the gate-source voltage $V_{gs}$, the drain-source voltage $V_{ds}$, and the drain current $I_d$ of the main switching element 2. In addition, the drain current $I_d$ may be considered to be large if the value is 50% or more and small if it is 50% or less with respect to the rated current value of the main switching element 2, but the reference value is not limited to this. Also, the drain current $I_d$ with respect to the rated current value may also be determined from the surge voltage value in the actual operations.

When the gate drive signal from the gate drive unit 61 becomes low in response to the input signal to the main switching element 2 being switched from high (ON command) to low (OFF command) and the negative gate current Ig begins to flow, the implantation of gate charges into the main switching element 2 in the reverse bias direction is started. And then, the gate input capacitance $C_{gs}$ of the main switching element 2 is charged in the reverse bias direction, and the gate source voltage $V_{gs}$ starts to decrease (time point t1).

Subsequently, when the gate source voltage $V_{gs}$ is reduced to the mirror voltage (time point t2), the charging of the feedback capacitance (gate drain capacitance) $C_{gs}$ is started, and the change of the gate source voltage $V_{gs}$ becomes flat (so-called Miller period), and the drain-source voltage $V_{ds}$ of the main switching elements 2 is sharply increased. Along with this, the drain-source voltage $V_{ds}$ of the main switching element 1 facing the main switching element 2 decreases, and the discharge current flows from the parasitic capacitance $C_{ds}$, so the drain current $I_d$ of the main switching element 2 decreases.

Next, at time points t3 and t3', the Miller period in the main switching element 2 ends, and the drain current $I_d$ sharply decreases. Thereby, the voltage applied to the wiring inductance of the positive power source line 101 instantaneously increases, and the drain-source voltage $V_{ds}$ of the main switching element 2 exceeds the reference voltage $V_{ref}$ to reach the peak voltages Vp and Vp', at time points t4 and t4'. After that, the drain-source voltage $V_{ds}$ decreases to the DC voltage Ed, and the gate-source voltage $V_{gs}$ falls below the gate threshold voltage Vth. Then, the charging of the gate input capacitance $C_{gs}$ of the main switching element 2 in the reverse bias direction is ended, and the turn-off of the main switching element 2 is completed.

Herein, the period $\Delta T2$ from the start of the turn-off to the voltage $V_{ds2}$ reaching the reference voltage $V_{ref}$ is longer than the period $\Delta T1$ from the start of the turn-off to the voltage $V_{ds1}$ reaching the reference voltage $V_{ref}$. As can be seen from this, when the current $I_d$ flowing through the main switching element 2 is small, the period $\Delta T$ from the start of turning-off the main switching element 2 to the voltage $V_{ds}$ reaching the reference voltage $V_{ref}$ becomes long. Also, when the current $I_d$ flowing through the main switching element 2 is small, the peak voltage decreases.

Figure 4:
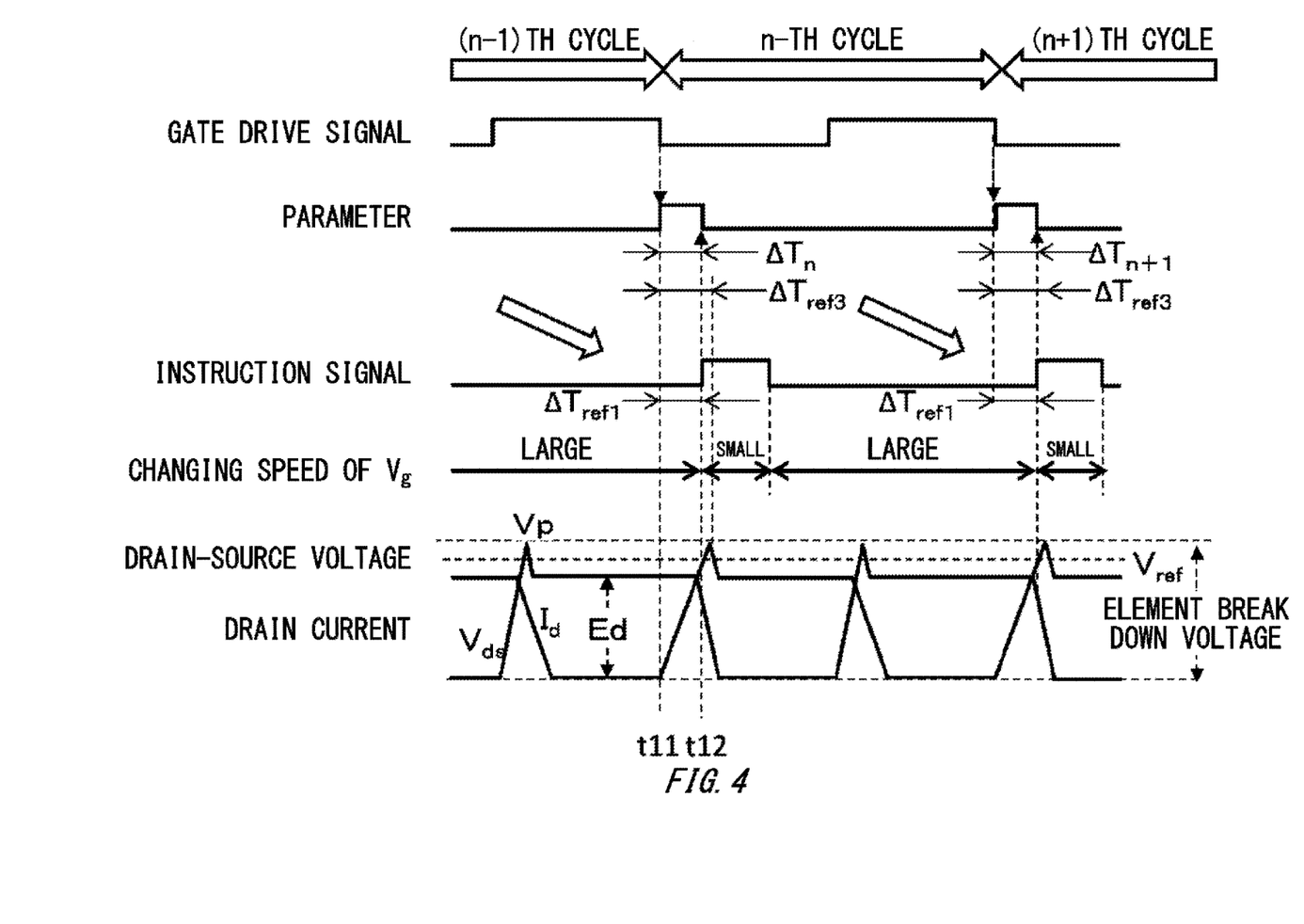
FIG. 4 illustrates the operation waveform at the turn-off by the switching device 100.

[3-2. Operation Waveform by Switching Device 100 of Embodiment (1)] FIG. 4 illustrates the operation waveform at the turn-off by the switching device 100.

When the input signal to the main switching element 2 switches from high (ON command) to low (OFF command) at time point t11 in the n-th switching cycle, the period $\Delta T_n$ until the voltage $V_{ds}$ reaches the reference voltage $V_{ref}$ (the period from the time point t11 to t12 in this exemplary operation) is measured as a parameter. In this exemplary operation, the current $I_d$ is large enough to generate a surge voltage larger than the element breakdown voltage, and the period $\Delta T_n$ is shorter than the third reference period $\Delta T_{ref3}$. Thereby, in the (n+1)th switching cycle, the changing speed of the gate voltage after the first reference period $\Delta T_{ref1}$ from the start of the turn-off is switched by the instruction signal from the switching determination unit 632 and becomes smaller. In this manner, when the surge voltage can be generated higher than the element breakdown voltage due to the turn-off, the change of the gate voltage is delayed, and the element destruction due to the surge voltage is prevented.

In addition, as one example of this exemplary operation, the instruction signal is maintained at a high level from the timing when the first reference period $\Delta T_{ref1}$ has elapsed to the timing after the turn-off is completed. Also, in the (n−1)th cycle and the (n+1)th cycle, the periods $\Delta T_{n-1}$ and $\Delta T_{n+1}$ as parameters are shorter than the third reference period $\Delta T_{ref3}$.

Figure 5:
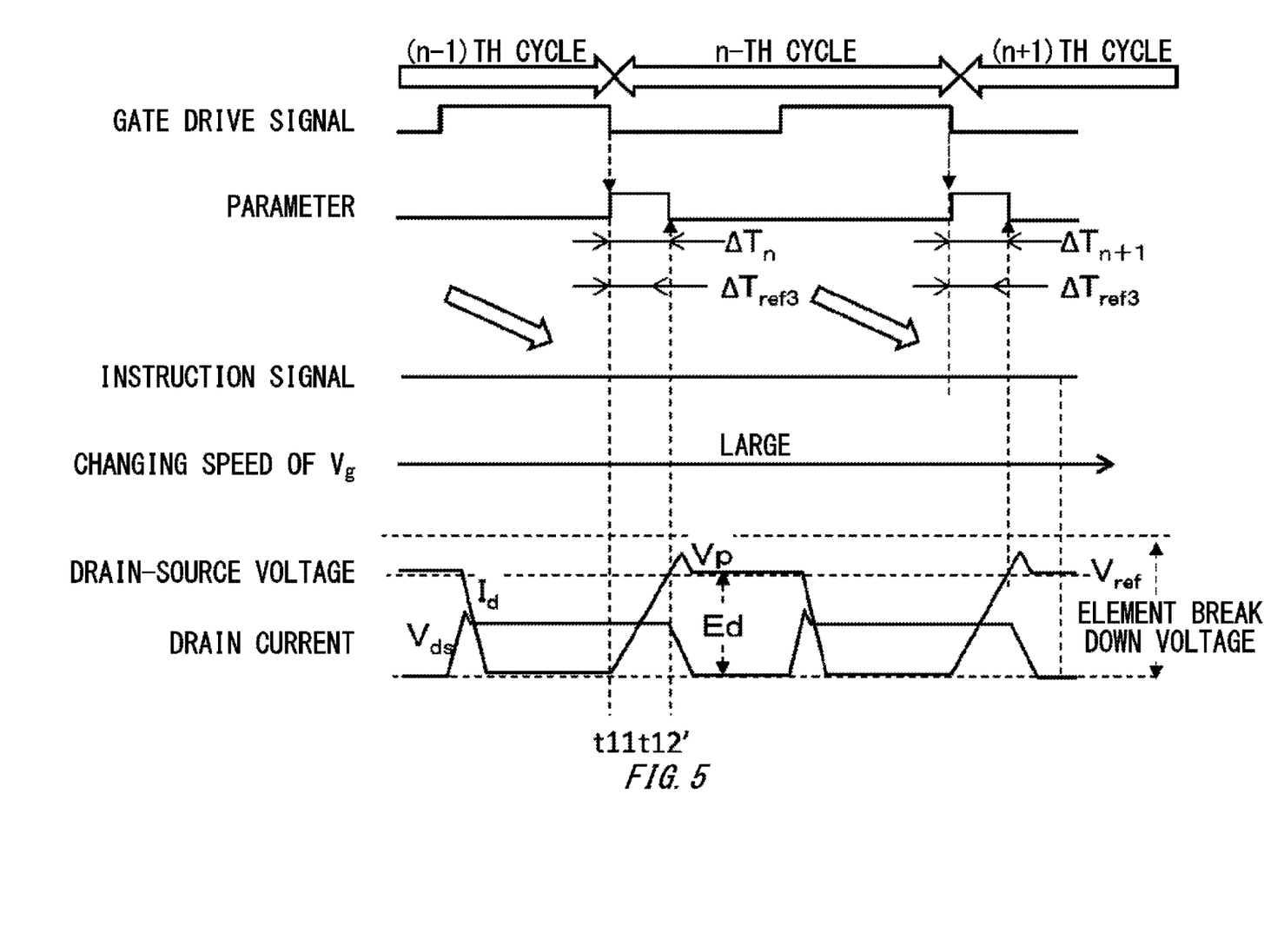
FIG. 5 illustrates another operation waveform at the turn-off by the switching device 100.

[3-2. Operation Waveform by Switching Device 100 of Embodiment (2)] FIG. 5 illustrates another operation waveform at the turn-off by the switching device 100.

When the input signal to the main switching element 2 switches from high (ON command) to low (OFF command) at time point t11 in the n-th switching cycle, the period $\Delta T_n$ until the voltage $V_{ds}$ reaches the reference voltage $V_{ref}$ (the period from time point t11 to t12' in this exemplary operation) is measured as a parameter. In this exemplary operation, the current $I_d$ is small enough not to generate a surge voltage larger than the element breakdown voltage, and the period $\Delta T_n$ is longer than the third reference period $\Delta T_{ref3}$. Thereby, in the (n+1)th switching cycle, the changing speed of the gate voltage after the first reference period $\Delta T_{ref1}$ from the start of the turn-off is maintained to be large without being switched. In this manner, when the surge voltage is not generated higher than the element breakdown voltage due to the turn-off, the change of the gate voltage is maintained to be fast, and the turn-off loss is reduced. In addition, as one example of this exemplary operation, in the (n−1)th cycle and the (n+1)th cycle, the periods $\Delta T_{n-1}$ and $\Delta T_{n+1}$ as parameters are longer than the third reference period $\Delta T_{ref3}$.

Figure 6:
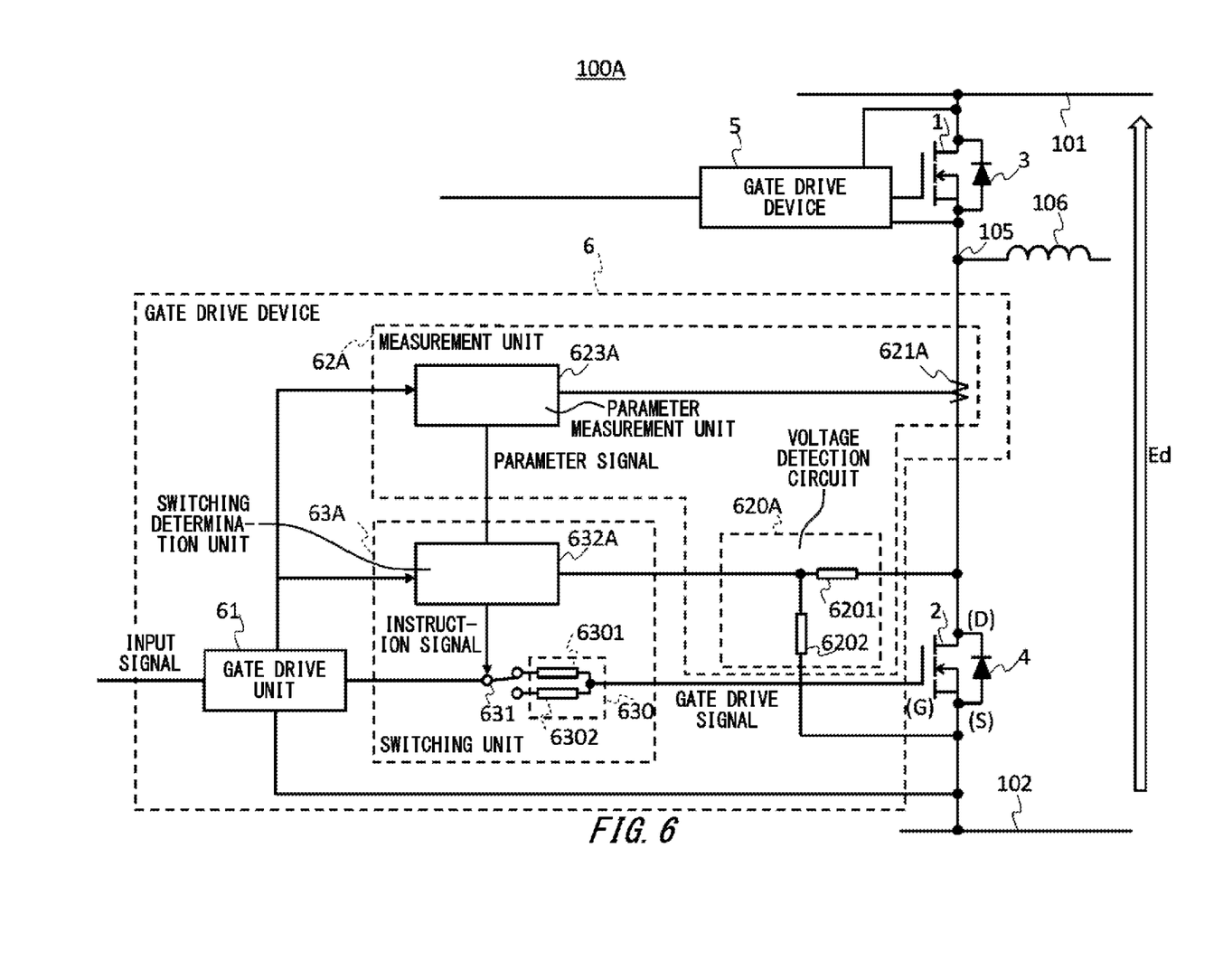
FIG. 6 illustrates a switching device 100A according to a modification example.

[4. Modification Example] FIG. 6 illustrates the switching device 100A according to a modification example. The switching device 100A includes a measurement unit 62A and a switching unit 63A. As one example of this embodiment, each unit of the measurement unit 62A and the switching unit 63A will be described as an analog circuit.

The measurement unit 62A measures a value indicating the current $I_d$ when the main switching element 2 is at the ON state, as a parameter that changes according to the current $I_d$ flowing through the main switching element 2. The measurement unit 62A has a current sensor 620A, a parameter measurement unit 623A and a voltage detection circuit 620A.

The current sensor 620A measures the current $I_d$. As one example of this modification example, the current sensor 620A is provided on the drain terminal side of the main switching element 2, but may also be provided on the source terminal side. The current sensor 620A may supply the measured current value to the parameter measurement unit 623A.

The parameter measurement unit 623A measures the parameter based on the current value from the current sensor 620A. For example, the parameter measurement unit 623A may measure the current $I_d$ at the reception timing of the OFF command signal included in the gate drive signal as the parameter.

The voltage detection circuit 620A has the same resistances 6201 and 6202 as those of the voltage detection circuit 620. The voltage detection circuit 620A supplies voltage detected by the resistances 6201 and 6202 to the switching unit 63A.

The switching determination unit 632A of the switching unit 63A determines whether to switch the changing speed of the gate voltage in response to the comparison result between the parameter supplied from the measurement unit 62 (as one example of this modification example, the current $I_d$ when the main switching element 2 is at ON state) and the reference value. The reference value may be a value of a parameter (current $I_d$) when the surge voltage generated by turning off the main switching element 2 reaches the lowest element breakdown voltage in the switching device 100. The switching unit 63A may perform the switching at the timing of the lapse of the first reference period $\Delta T_{ref1}$ from the start of the turn-off. As one example, the switching unit 63A may perform switching at any timing from the start timing of the turn-off this time to the timing when the voltage $V_{ds}$ of the main switching element 2 reaches its peak during the turn-off period this time, based on the voltage supplied by the voltage detection circuit 620A.

The switching device 100A described above can also prevent element destruction due to surge voltage and reduce turn-off loss at the same time.

[5. Other Modification Examples] In addition, in the above-described embodiment, the switching unit 63 has been described as switching the resistance value of the gate resistor 630 to switch the changing speed of the gate voltage, but the switching may also be performed by another method. For example, the switching unit 63 may also reduce the current of the gate drive signal. To reduce the current of the gate drive signal, for example, the internal path of the gate drive signal toward the gate may be branched and diverted.

Also, although the parameter that changes according to the current $I_d$ has been described as the period $\Delta T$ or the like, another value may also be used. For example, the parameter may indicate the voltage applied to the main switching element 2 after the second reference period $\Delta T_{ref2}$ from the start of turning off the main switching element 2. The second reference period $\Delta T_{ref2}$ may be equal to or less than the period from the start of the turn-off to the completion of the turn-off. In this case, the switching unit 63 may switch the changing speed of the gate voltage after the first reference period $\Delta T_{ref1}$ from the start of turning off the switching element in response to the parameter indicating the voltage being larger than the reference value. Even in this case, the element destruction due to the surge voltage can be prevented, and at the same time, the turn-off loss can be reduced. In addition, the second reference period $\Delta T_{ref2}$ and the first reference period $\Delta T_{ref1}$ may be the same or different. When the second reference period $\Delta T_{ref2}$ is different from the first reference period $\Delta T_{ref1}$, the second reference period $\Delta T_{ref2}$ may be longer or shorter than the first reference period $\Delta T_{ref1}$.

Also, when the main switching element 2 is turned off, the parameter may also indicate the generated surge voltage. As one example, the surge voltage may be detected by the voltage detection circuit 620. In this case, the switching unit 63 may switch the changing speed of the gate voltage based on the parameter indicating the surge voltage and whether the changing speed of the gate voltage is switched in the switching cycle in which the parameter is measured. For example, as shown in the table 1 below, the switching unit 63 may switch the changing speed after the first reference period $\Delta T_{ref1}$ from the start of the turn-off in the next switching cycle, based on whether the parameter indicating the surge voltage of the previous switching cycle is larger than the reference value, and whether the changing speed of the gate voltage is changed. Even in this case, the element destruction due to the surge voltage can be prevented, and at the same time, the turn-off loss can be reduced. Also, different from the case of determining whether to execute switching only based on the parameter indicating the surge voltage, it is possible to prevent a surge voltage exceeding the element breakdown voltage from occurring every other switching cycle.

may have n parameter storage units for latching the parameters measured by the parameter measurement unit 623. The n parameter storage units may store the measured parameters sequentially and supply them to the switching determination unit 632. The number n of parameter storage units may be equal to the number of cycles from the cycle in which the parameter is measured to the cycle in which the changing speed is switched.

Also, although it has been described that the changing speed of the gate voltage is reduced or maintained based on the parameter, it may also be increased without maintaining the changing speed. In this case, the turn-off loss can be further reduced.

Also, the switching devices 100 and 100A have been described as including a set of the positive side main switching element 1 and the gate drive device 5, and a set of the negative side main switching element 2 and the gate drive device 6, but only one of the sets may be included.

Also, although each unit of the gate drive device 6 has been described as an analog circuit, at least one of the comparison units 621, the parameter measurement unit 623, and the switching determination unit 632 may also be a digital circuit. Similarly, although each unit of the measurement unit 62A and the switching unit 63A has been described as an analog circuit, at least one of the parameter measurement unit 623A and the switching determination unit 632A may also be a digital circuit.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: main switching element; 2, main switching element; 3: freewheeling diode; 4: freewheeling diode; 5: gate drive

TABLE 1

| | | THE GATE VOLTAGE CHANGING SPEED HAS BEEN SWITCHED IN THE LAST SWITCHING CYCLE | |
|---|---|---|---|
| | | SWITCHED | NOT SWITCHED |
| MAGNITUDE OF THE SURGE VOLTAGE IN THE LAST SWITCHING CYCLE | LARGE | SWITCH | SWITCH |
| | SMALL | SWITCH | NOT SWITCH |

Also, it was described that the changing speed of the gate voltage in the next turn-off period is switched based on the parameter measured in the previous switching cycle, but the switching of the changing speed during the next and subsequent turn-off periods may also be performed based on the parameter measured in the switching cycles before the previous two times. In this case, the measurement unit 62 device; 6: gate drive device; 61: gate drive unit; 62: measurement unit; 63: switching unit; 100: switching device; 101: positive power source line; 102: negative power source line; 105: power source output terminal; 106: induction load; 620: voltage detection circuit; 621: comparison unit; 623: parameter measurement unit; 630: gate resistor; 631: connection switching unit; 632: switching determination unit; 6201: resistance; 6202: resistance; 6301: gate resistor; 6302: gate resistor

What is claimed is:

1. A gate drive device comprising:
a gate drive unit for driving a gate of a switching element;
a measurement unit for measuring a parameter that changes according to a current flowing through the switching element before the switching element is turned off; and
a switching unit for switching a changing speed of a gate voltage of the switching element by the gate drive unit after a first reference period from a start of turning off the switching element based on the parameter, wherein the parameter indicates a surge voltage generated when the switching element is turned off.

2. The gate drive device according to claim 1, wherein the switching unit switches the changing speed of the gate voltage after the first reference period from the start of turning off the switching element during a turn-off period of the switching element.

3. The gate drive device according to claim 2, wherein the switching unit reduces the changing speed of the gate voltage after the first reference period from the start of turning off the switching element during the turn-off period of the switching element.

4. The gate drive device according to claim 3, wherein the switching unit changes the changing speed of the gate voltage after the first reference period from the start of turning off the switching element during one turn-off period of the switching element, with respect to the changing speed of the gate voltage after the first reference period from the start of turning off the switching element during another turn-off period.

5. The gate drive device according to claim 4, wherein the switching unit switches the changing speed of the gate voltage after the first reference period from the start of turning off the switching element in next and subsequent turn-off periods of the switching element, based on the parameter measured in previous switching cycles of the switching element.

6. The gate drive device according to claim 3, wherein the switching unit switches the changing speed of the gate voltage after the first reference period from the start of turning off the switching element in next and subsequent turn-off periods of the switching element, based on the parameter measured in previous switching cycles of the switching element.

7. The gate drive device according to claim 2, wherein the switching unit changes the changing speed of the gate voltage after the first reference period from the start of turning off the switching element during one turn-off period of the switching element, with respect to the changing speed of the gate voltage after the first reference period from the start of turning off the switching element during another turn-off period.

8. The gate drive device according to claim 7, wherein the switching unit switches the changing speed of the gate voltage after the first reference period from the start of turning off the switching element in next and subsequent turn-off periods of the switching element, based on the parameter measured in previous switching cycles of the switching element.

9. The gate drive device according to claim 2, wherein the switching unit switches the changing speed of the gate voltage after the first reference period from the start of turning off the switching element in next and subsequent turn-off periods of the switching element, based on the parameter measured in previous switching cycles of the switching element.

10. The gate drive device according to claim 2, wherein the first reference period is a period beginning from the start of turning off the switching element and ending on or before a time at which a voltage generated between main terminals of the switching element reaches a peak.

11. The gate drive device according to claim 1, wherein the switching unit switches the changing speed of the gate voltage after the first reference period from the start of turning off the switching element in next and subsequent turn-off periods of the switching element, based on the parameter measured in previous switching cycles of the switching element.

12. The gate drive device according to claim 1, wherein the first reference period is a period beginning from the start of turning off the switching element and ending on or before a time at which a voltage generated between main terminals of the switching element reaches a peak.

13. The gate drive device according to claim 1, wherein the first reference period is a period from the start of turning off the switching element to a time at which a Miller period of the gate voltage ends.

14. The gate drive device according to claim 1, wherein the switching unit has a switching determination unit for determining whether to switch the changing speed of the gate voltage according to a comparison result between the parameter and a reference value.

15. The gate drive device according to claim 1, wherein the parameter indicates the current when the switching element is at ON state.

16. The gate drive device according to claim 1, wherein the parameter indicates a period from the start of turning off the switching element to a time when a voltage applied between main terminals of the switching element reaches a reference voltage.

17. The gate drive device according to claim 1, wherein the parameter indicates a voltage applied to the switching element after a second reference period has elapsed from the start of turning off the switching element.

18. The gate drive device according to claim 1, wherein the switching unit switches the changing speed of the gate voltage based on the parameter and whether the changing speed of the gate voltage has been switched in a switching cycle in which the parameter is measured.

19. A switching device comprising:
the gate drive device according to claim 1; and
the switching element whose gate is driven by the gate drive device.

20. The switching device according to claim 19, wherein the switching element is a wide bandgap semiconductor element.

* * * * *